(12) United States Patent
Ueno

(10) Patent No.: US 8,829,568 B2
(45) Date of Patent: Sep. 9, 2014

(54) GALLIUM NITRIDE SEMICONDUCTOR DEVICE AND METHOD FOR PRODUCING THE SAME

(75) Inventor: Katsunori Ueno, Matsumoto (JP)

(73) Assignee: Fuji Electric Co., Ltd. (JP)

(*) Notice: Subject to any disclaimer, the term of this patent is extended or adjusted under 35 U.S.C. 154(b) by 89 days.

(21) Appl. No.: 12/554,373

(22) Filed: Sep. 4, 2009

(65) Prior Publication Data

US 2010/0109015 A1 May 6, 2010

(30) Foreign Application Priority Data

Sep. 30, 2008 (JP) .................. 2008-253165
Mar. 31, 2009 (JP) .................. 2009-087896

(51) Int. Cl.
*H01L 29/66* (2006.01)

(52) U.S. Cl.
USPC ............ 257/192; 257/76; 257/168; 257/170; 257/339; 257/409; 257/487; 257/491; 257/E21.387; 257/E21.403; 257/E21.405; 257/E21.407

(58) Field of Classification Search
CPC ............ H01L 29/0847; H01L 29/2003; H01L 29/66462
USPC ........... 257/76, 168, 170, 339, 409, 487, 491, 257/192, E21.387, E21.403, E21.405, 257/E21.407
See application file for complete search history.

(56) References Cited

U.S. PATENT DOCUMENTS

| 6,563,193 B1* | 5/2003 | Kawaguchi et al. .......... 257/575 |
| 2005/0189562 A1 | 9/2005 | Kinzer et al. |
| 2007/0096225 A1* | 5/2007 | Khemka et al. .............. 257/409 |

FOREIGN PATENT DOCUMENTS

| JP | 2004-281454 A | 10/2004 |
| JP | 2006-086398 A | 3/2006 |
| JP | 2006-100645 A | 4/2006 |
| JP | 2007-522677 A | 8/2007 |
| JP | 2008-177527 A | 7/2008 |
| JP | 2008-198675 A | 8/2008 |
| JP | 2008-004720 A | 10/2008 |

OTHER PUBLICATIONS

Partial English translation of Japanese Office Action cited in Japanese counterpart application No. JP2009-087896, dated Apr. 23, 2013.

* cited by examiner

*Primary Examiner* — Jay C Kim
(74) *Attorney, Agent, or Firm* — Rossi, Kimms & McDowell LLP

(57) ABSTRACT

An insulating layer, an undoped first GaN layer and an AlGaN layer are laminated in this order on a surface of a semiconductor substrate. A surface barrier layer formed by a two-dimensional electron gas is provided in an interface between the first GaN layer and the AlGaN layer. A recess (first recess) which reaches the first GaN layer but does not pierce the first GaN layer is formed in a surface layer of the AlGaN layer. A first high withstand voltage transistor and a control circuit are formed integrally on the aforementioned semiconductor substrate. The first high withstand voltage transistor is formed in the first recess and on a surface of the AlGaN layer. The control circuit includes an n-channel MOSFET formed in part of the first recess, and a depression type n-channel MOSFET formed on a surface of the AlGaN layer. In this manner, there are provided a gallium nitride semiconductor device which can be used under a high temperature environment while reduction in total circuit size can be attained, and a method for producing the gallium nitride semiconductor device.

3 Claims, 13 Drawing Sheets

GALLIUM NITRIDE SEMICONDUCTOR DEVICE AND METHOD FOR PRODUCING THE SAME

BACKGROUND OF THE INVENTION

A. Field of the Invention

The present invention relates to a gallium nitride semiconductor device and a method for producing the same.

B. Description of the Related Art

A gallium nitride (GaN) compound semiconductor (hereinafter referred to as GaN semiconductor element) has been heretofore used as a semiconductor material of a semiconductor element for high-frequency device use. In the GaN semiconductor element, a buffer layer and a doped GaN layer, for example, formed by a metal organic chemical vapor deposition (MOCVD) method are provided on a surface of a semiconductor substrate.

FIG. 14 is a sectional view showing a lateral structure gallium nitride semiconductor element according to the background art. As shown in FIG. 14, in the lateral structure GaN semiconductor element, a buffer layer 1002, silicon-doped n-type GaN layer 1003 and aluminum gallium nitride (AlGaN) layer 1004 are laminated in this order on a surface of semiconductor substrate 1001. Buffer layer 1002 corresponds to a raw material used for the semiconductor substrate 1001. Surface barrier layer 1005 formed by a two-dimensional electron gas (2DEG) is provided in an interface between n-type GaN layer 1003 and AlGaN layer 1004. Surface barrier layer 1005 serves as a conductive layer exhibiting high channel mobility. Source electrode 1012, drain electrode 1013, and gate electrode 1016 which is provided with interposition of insulating film 1007 are formed on a surface of AlGaN layer 1004. Although almost all lateral structure GaN semiconductor elements have the structure as shown in FIG. 14, various GaN semiconductor elements having high voltage withstanding have been achieved as other type GaN semiconductor elements by formation of a structure for achieving high voltage withstanding and a structure of a gate electrode.

In this GaN semiconductor element, a voltage applied to gate electrode 1016 is regulated to control the electron concentration of surface barrier layer 1005 to thereby turn on/off a current flowing between the source and the drain. Generally, in such a GaN semiconductor element, connection between the source and the drain is electrically conductive (hereinafter referred to as 'normally-on') when there is no voltage applied to gate electrode 1016. Therefore, a configuration in which a gate electrode having Schottky characteristic is formed as gate electrode 1016 or a configuration in which a p-type layer is formed between AlGaN layer 1004 and gate electrode 1016 is used to control the electron concentration of surface barrier layer 1005.

The normally-on type GaN semiconductor element however has limited uses. Therefore, a GaN semiconductor element in which connection between the source and the drain is not conductive (hereinafter referred to as 'normally-off') when there is no voltage applied to gate electrode 1016 has been proposed recently. A GaN semiconductor element having a metal oxide semiconductor field effect transistor (MOSFET) structure is an example of the normally-off type GaN semiconductor element.

Lateral structure transistors with a withstand voltage achieved in a range of from several hundreds of V to several kV at maximum have been produced by way of trial as high withstand voltage devices using such GaN semiconductor elements. Some of these lateral structure transistors have been commercially available. When a transistor using a GaN semiconductor element is used as a switching device of a power converter such as an inverter, on-resistance of the GaN semiconductor element can be reduced compared with that of the Si semiconductor element according to the background art, and the switching device can be operated speedily. Accordingly, reduction in size of the semiconductor element can be attained. Moreover, power loss can be greatly reduced. For this reason, both reduction in size and increase in power density of the switching device can be achieved. Moreover, because the GaN semiconductor element can be used at a high temperature compared with the Si semiconductor element, there is an increasing demand that the GaN semiconductor element should be used in a high temperature environment, such as in the area around a car engine.

The following device has been proposed as a semiconductor device using such a GaN semiconductor element. While a SiCMOS switching transistor is formed on a Si-off substrate, an AlGaN—GaN field effect transistor is formed so as to be integrated with the SiCMOS switching transistor through a GaN buffer layer. A voltage is applied to at least one terminal of the AlGaN—GaN field effect transistor by a DC-DC converter. Part of the DC-DC converter is formed of a SiCMOS switching transistor (see, for example, JP-A-2004-281454).

The following device also has been proposed as a variation. In a GaN semiconductor integrated circuit in which a plurality of GaN semiconductor elements which differ in kind are integrated on one substrate, the GaN semiconductor elements include a Schottky diode and a field effect transistor. A first anode electrode is provided on a GaN semiconductor layer having a predetermined width and forming the Schottky diode so that the first anode electrode is Schottky-contacted to the GaN semiconductor layer with a narrower width than the predetermined width. A second anode electrode is provided on another portion of the GaN semiconductor layer than the portion contacted to the first anode electrode so that the second anode electrode is Schottky-contacted to the GaN semiconductor layer and electrically connected to the first anode electrode. The height of a Schottky barrier formed between the first anode electrode and the GaN semiconductor layer is lower than the height of a Schottky barrier formed between the second anode electrode and the GaN semiconductor layer (see, for example, JP-A-2006-100645).

The following device has been proposed as another device. A GaN layer laminated on a substrate directly or through a buffer layer, a plurality of transistors formed near a surface of the GaN layer, an oxide or nitride film for covering front and side surfaces of the transistors, and an AlGaN layer laminated on the oxide or nitride film-including GaN layer by ELO are formed by repeated lamination in accordance with the number of the transistors to be integrated (see, for example, JP-A-2008-198675).

The following device has been proposed as yet another device. That is, a device includes a conducting layer, a channel layer of a Group III-Group V nitride semiconductor formed above the conducting layer, a Schottky layer of a Group III-Group V nitride semiconductor formed on the channel layer, a first source electrode, a drain electrode and a gate electrode formed in part above the Schottky layer, a second source electrode connected to the first source electrode, and a wiring member for connecting the first source electrode and the conducting layer to each other through a groove piercing the channel layer and the Schottky layer (see, for example, JP-A-2006-086398).

The following device has been proposed as another device. That is, a device includes a substrate, a nitride semiconductor layer formed on a principal surface of the substrate and having a channel region in which electrons run in a direction parallel to the principal surface, a plurality of first electrodes and a plurality of second electrodes formed so as to be separated from one another and disposed alternately on an active region of the nitride semiconductor layer, a first insulating film and an interlayer insulating film formed in ascending order on the nitride semiconductor layer and having a plurality of openings in which the first electrodes are exposed respectively, and a first electrode pad formed on a region of the interlayer insulating film above the active region and electrically connected to respective portions of the first electrodes exposed from the openings. The substrate further has a second electrode pad which has conducting property and which is formed on an opposite surface to the principal surface of the substrate. The second electrode pad is electrically connected to the second electrode (see, for example, JP-A-2008-177527).

When the aforementioned high withstand voltage GaN semiconductor element is used as a switching device (hereinafter referred to as 'semiconductor switch'), a semiconductor device is often configured so that semiconductor elements are operated alternately by use of a plurality of semiconductor switches at predetermined timing. FIG. 15 is a circuit diagram showing a semiconductor device using semiconductor switches according to the background art. The switching circuit shown in FIG. 15 includes semiconductor switches 1040 to 1042 (fourth semiconductor switch et seq. are not shown), control circuit 1048, ground terminal (hereinafter referred to as 'GND terminal') 1046, control signal input terminal (hereinafter referred to as 'IN terminal') 1047, circuit portion power supply terminal (hereinafter referred to as 'VD terminal') 1049, and high withstand voltage output terminals (hereinafter referred to as 'OUT terminals') 1050 to 1052. The semiconductor switches 1040 to 1042 and control circuit 1048 are formed in semiconductor devices 1100 to 1300 and semiconductor device 1400 respectively.

Control circuit 1048 is a circuit for driving semiconductor switches 1040 to 1042 alternately at predetermined timing. An input signal from IN terminal 1047 is fed as one of gate input signals 1043 to 1045 to one of semiconductor switches 1040 to 1042. When, for example, semiconductor switch 1040 should be driven, gate input signal 1043 is selected.

In this situation, it is necessary to dispose semiconductor switches 1040 to 1042 as near as possible. However, because the semiconductor switches are formed separately in semiconductor devices 1100 to 1300 respectively, the distance between adjacent ones of the semiconductor switches is limited, for example, by the size of a mount region or each semiconductor device in a printed substrate. Moreover, it is necessary to provide connection pad regions, external wiring regions, etc. for connecting the respective semiconductor switches and control circuit 1048 to the outside. For this reason, it is difficult to reduce the total size of the switching circuit even if the GaN semiconductor element were used as a semiconductor switch. Moreover, there is a problem of signal delay due to external wiring or malfunction caused by production of noise. When a Si semiconductor element is used as an element forming control circuit 1048, the effect based on use of the GaN semiconductor element cannot be realized because control circuit 1048 cannot be used at a temperature exceeding about 200° C., which is a heat-resistant temperature of the Si semiconductor element.

The present invention is directed to overcoming or at least reducing the effects of one or more of the problems set forth above.

SUMMARY OF THE INVENTION

The invention provides a gallium nitride semiconductor device which can reduce the total size of a circuit provided with semiconductor elements to solve the problem in the background art, and it further provides a method for producing the gallium nitride semiconductor device. The invention provides a gallium nitride semiconductor device which can be used under a high temperature environment, and a method for producing the gallium nitride semiconductor device.

To solve the aforementioned problems, a gallium nitride semiconductor device according to a first configuration of the invention includes: a first semiconductor layer containing gallium nitride; a second semiconductor layer containing gallium nitride and formed on part of a surface of the first semiconductor layer; a first semiconductor element formed in the first and second semiconductor layers and having a high withstand voltage; and a second semiconductor element formed in either of the first and second semiconductor layers and having a low withstand voltage, wherein the first semiconductor layer has an insulating region provided between the first and second semiconductor elements for separating the first and second semiconductor elements from each other.

A gallium nitride semiconductor device according to a second configuration of the invention includes: a first semiconductor layer containing gallium nitride; a second semiconductor layer formed on part of a surface of the first semiconductor layer and containing gallium nitride; and a plurality of first semiconductor elements formed in the first and second semiconductor layers and having a high withstand voltage, wherein the first semiconductor layer has insulating regions provided between adjacent ones of the first semiconductor elements for separating the first semiconductor elements from one another.

A gallium nitride semiconductor device according to a third configuration of the invention is an invention according to the first or second configuration, wherein the second semiconductor layer is an aluminum gallium nitride layer.

A gallium nitride semiconductor device according to a fourth configuration of the invention is an invention according to any one of the first to third configurations, wherein: the first semiconductor layer is of a first conductivity type; the second semiconductor layer is of a second conductivity type; and the first semiconductor element uses the second semiconductor layer as a drift region and further has a second conductivity type first source region formed on a surface layer of the first semiconductor layer where the second semiconductor layer is not formed, a first gate insulating film formed to cover a range of from part of a surface of the first source region to the second semiconductor layer, and a first gate electrode provided on a surface of the first gate insulating film.

A gallium nitride semiconductor device according to a fifth configuration of the invention is an invention according to any one of the first to third configurations, wherein: the first semiconductor layer is of a second conductivity type; the second semiconductor layer is of a first conductivity type; and the first semiconductor element uses the second semiconductor layer as a drift region and further has a second conductivity type first source region formed on a surface layer of the second semiconductor layer, a first gate insulating film formed to cover a range of from a surface of the first source region to part of the first semiconductor layer where the second semiconductor layer is not formed, and a first gate electrode provided on a surface of the first gate insulating film.

A gallium nitride semiconductor device according to a sixth configuration of the invention is an invention according to the fifth configuration, further including: a semiconductor substrate having conducting property; the first semiconductor layer provided on a surface of the semiconductor substrate through an insulating layer; a source electrode being in contact with the first source region; a drain electrode provided on a surface of the semiconductor substrate opposite to the insulating layer; a short-circuit electrode embedded in a depth from the first semiconductor layer where the second semiconductor layer is not formed, to the semiconductor substrate while piercing the insulating layer and provided for short-circuiting the first semiconductor layer and the semiconductor substrate to each other; a second conductivity type high concentration semiconductor region formed in a boundary between the first semiconductor layer and the short-circuit electrode so as to be in contact with the short-circuit electrode and having a higher concentration than that of the first semiconductor layer; and an interlayer insulating film for electrically insulating the short-circuit electrode and the source electrode from each other.

A gallium nitride semiconductor device according to a seventh configuration of the invention is an invention according to any one of the first, third and fourth configurations, wherein: the second semiconductor element has a second conductivity type insulated gate field effect transistor, and a resistance load; the second conductivity type insulated gate field effect transistor has a second source region and a first drain region on a surface of the first semiconductor layer; and the resistance load is formed from the first semiconductor layer and the second semiconductor layer.

A gallium nitride semiconductor device according to an eighth configuration of the invention is an invention according to any one of the first, third and fourth configurations, wherein: the second semiconductor element further has a high concentration first conductivity type third semiconductor layer formed on a surface of the second semiconductor layer; the second semiconductor element is formed from a second conductivity type insulated gate field effect transistor and a first conductivity type insulated gate field effect transistor; the second conductivity type insulated gate field effect transistor has a second source region and a first drain region on a surface of the first semiconductor layer; and the first conductivity type insulated gate field effect transistor uses the third semiconductor layer as a third source region and a second drain region.

A gallium nitride semiconductor device according to a ninth configuration of the invention includes: a semiconductor substrate having conducting property; a second conductivity type first semiconductor layer provided on a surface of the semiconductor substrate through an insulating layer and containing gallium nitride; a first conductivity type second semiconductor layer formed on part of a surface of the first semiconductor layer and containing gallium nitride; a second conductivity type first source region formed in a surface layer of the second semiconductor layer; a source electrode being in contact with the first source region; a drain electrode provided on a surface of the semiconductor substrate opposite to the insulating layer; a short-circuit electrode embedded in a depth from the first semiconductor layer where the second semiconductor layer is not formed, to the semiconductor substrate while piercing the insulating layer and provided for short-circuiting the first semiconductor layer and the semiconductor substrate to each other; a second conductivity type high concentration semiconductor region formed in a boundary between the first semiconductor layer and the short-circuit electrode so as to be in contact with the short-circuit electrode and having a higher concentration than that of the first semiconductor layer; and an interlayer insulating film for electrically insulating the short-circuit electrode and the source electrode from each other.

A method of producing a gallium nitride semiconductor device according to a tenth configuration of the invention includes the steps of: epitaxially growing a second conductivity type second semiconductor layer containing gallium nitride on a surface of a first conductivity type first semiconductor layer containing gallium nitride; removing part of the second semiconductor layer; and forming a low withstand voltage second semiconductor element on the first and second semiconductor layers while forming a high withstand voltage first semiconductor element on the first and second semiconductor layers, wherein the method further includes the step of epitaxially growing a high concentration first conductivity type third semiconductor layer on part of a surface of the second semiconductor layer before forming the first and second semiconductor elements.

According to the invention, because the first and second semiconductor elements are formed in one semiconductor device, the total size of a circuit in which the first and second semiconductor elements are mounted can be reduced greatly. Moreover, because the whole of the circuit can be formed of gallium nitride semiconductor elements, the semiconductor device can be used under a high temperature environment compared with the case where a circuit formed of Si semiconductor elements is used. Moreover, because external components such as external wiring can be dispensed with, lowering of the operating speed can be suppressed to attain reduction in power loss and cost. Moreover, because the second semiconductor element can be formed to have substantially the same structure as that of the first semiconductor element, the semiconductor device can be produced with little increase in the number of production steps. Accordingly, the production cost can be greatly reduced. Because the second semiconductor layer is formed by epitaxial growth, the channel mobility of the second semiconductor layer can be set to be substantially the same as the channel mobility of a single crystal layer. Moreover, because the third semiconductor layer is formed by epitaxial growth, the third semiconductor layer can be formed as a first conductivity type high concentration region.

According to the sixth configuration of the invention, in the first semiconductor element, a drain electrode is formed on a rear surface of the semiconductor substrate and a short-circuit electrode extending from the first semiconductor layer but not piercing the semiconductor substrate is provided so that a current can flow into the semiconductor substrate from the first source region provided on the second semiconductor layer. Moreover, because a high concentration semiconductor region is provided in a boundary between the first semiconductor layer and the short-circuit electrode so as to be contacted to the short-circuit electrode, a current flowing in the first semiconductor layer can be collected to the short-circuit electrode. Accordingly, the first semiconductor element can be formed as a quasi-vertical structure. Therefore, an electrode pad etc. provided on a front surface of the semiconductor element so as to be connected to the drain electrode of the first semiconductor element becomes unnecessary, so that the region for the unnecessary electrode pad, etc. can be reduced.

The gallium nitride semiconductor device and the method of producing the same according to the invention have an effect of reducing the total size of a circuit in which semiconductor elements are provided. There is another effect that cost can be reduced. There is a further effect that the semiconductor device can be used under a high temperature environment.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Preferred embodiments of the invention as to a gallium nitride semiconductor device and a method for producing the same will be descried below in detail with reference to the accompanying drawings. In the following description of embodiments and all the accompanying drawings, like numerals refer to like constituent parts for the sake of omission of duplicated description.

Embodiment 1

Figure 1:
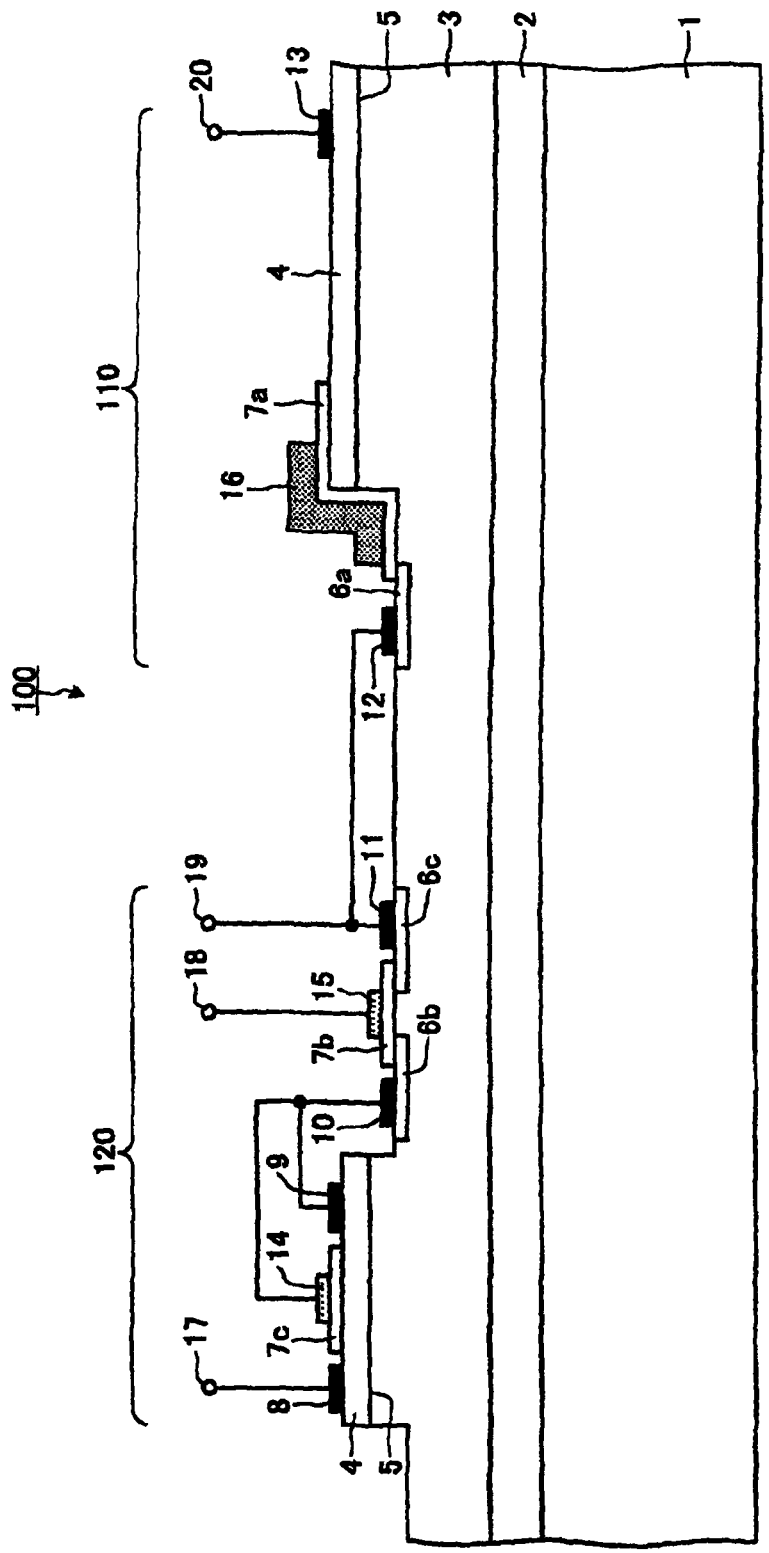
FIG. 1 is a sectional view showing a semiconductor device according to Embodiment 1.

FIG. 1 is a sectional view showing a semiconductor device according to Embodiment 1. In semiconductor device 100 shown in FIG. 1, insulating layer 2 is provided on a surface of semiconductor substrate 1. Undoped or n-type first GaN layer 3 (first semiconductor layer) is provided on a surface of insulating layer 2. AlGaN layer 4 (second semiconductor layer) is provided on part of a surface of first GaN layer 3. Surface barrier layer 5 formed by a two-dimensional electron gas is provided in an interface between first GaN layer 3 and AlGaN layer 4. A first recess which is dented but does not pierce first GaN layer 3 is provided in a region of first GaN layer 3 where AlGaN layer 4 is not provided. End portions of AlGaN layer 4 and surface barrier layer 5 are exposed on side wall portions of the first recess.

First high withstand voltage transistor 110 (first semiconductor element) and control circuit 120 (second semiconductor element) are formed integrally on the aforementioned semiconductor substrate 1. First high withstand voltage transistor 110 is formed on part (hereinafter referred to as 'first element region') of the first recess and the surface of AlGaN layer 4. First source region 6a is provided in part of a surface layer of a bottom portion of the first recess. First gate insulating film 7a is formed to cover a range of from part of a surface of first source region 6a to part of the surface of AlGaN layer 4. That is, an end portion of surface barrier layer 5 is covered with first gate insulating film 7a. First source electrode 12 is provided on the surface of first source region 6a. First gate electrode 16 is provided between first source region 6a and surface barrier layer 5 with interposition of first gate insulating film 7a. First drain electrode 13 is provided on part of the surface of AlGaN layer 4. High withstand voltage output terminal (OUT terminal) 20 is provided on first drain electrode 13.

Control circuit 120 includes an n-channel MOSFET (second conductivity type insulated gate field effect transistor) formed in part (hereinafter referred to as 'second element region') of the first recess, and a depression type n-channel MOSFET (resistance load) formed on a surface (hereinafter referred to as 'third element region') of AlGaN layer 4. The first element region and the second element region are formed so as to be separated from each other. In the n-channel MOSFET of control circuit 120, first drain region 6b and second source region 6c are provided in part of the surface layer of the bottom portion of the first recess so as to be separated from each other. Second gate insulating film 7b is provided to cover a range of from part of a surface of first drain region 6b to part of a surface of second source region 6c. Second drain electrode 10 is provided on the surface of first drain region 6b. Second gate electrode 15 is provided between first drain region 6b and second source region 6c with interposition of second gate insulating film 7b. Second source electrode 11 is provided on the surface of second source region 6c. Second source electrode 11 is short-circuited to first source electrode 12 of first high withstand voltage transistor 110. Ground terminal (GND terminal) 19 is connected to second source electrode 11. Control signal input terminal (IN terminal) 18 is connected to second gate electrode 15.

In the depression type n-channel MOSFET of control circuit 120, third drain electrode 8, third gate electrode 14 which is formed with interposition of third gate insulating film 7c, and third source electrode 9 are provided on a surface of AlGaN layer 4 so as to be separated from one another. Circuit portion power supply terminal (VD terminal) 17 is connected to third drain electrode 8. Third gate electrode 14 and third source electrode 9 are short-circuited to second drain electrode 10 of the n-channel MOSFET of control circuit 120 so that a circuit output signal of control circuit 120 is output. The circuit output signal is input as a gate input signal to first gate electrode 16 of first high withstand voltage transistor 110.

Insulating layer 2 is formed for electrically insulating the respective semiconductor elements formed on semiconductor substrate 1. Insulating layer 2 serves also effectively as a buffer layer for relaxing the thermal expansion coefficient difference and the grating constant difference which are formed between first GaN layer 3 and AlGaN layer 4 when first GaN layer 3 and AlGaN layer 4 are formed on the surface of semiconductor substrate 1.

Surface barrier layer 5 is a junction of first GaN layer 3 and AlGaN layer 4 different in band gap from each other, so that surface barrier layer 5 is filled with free electrons distributed two-dimensionally. Surface barrier layer 5 serves as a channel region exhibiting a high channel mobility.

In first high withstand voltage transistor 110 of semiconductor device 100, a voltage from control circuit 120 is applied to first gate electrode 16 to control the electron concentration of surface barrier layer 5 to thereby perform on/off control. In the n-channel MOSFET of control circuit 120, a voltage is applied to second gate electrode 15 to thereby perform on/off control. In the depression type n-channel MOSFET of control circuit 120, a voltage is applied to third gate electrode 14 to control the electron concentration of surface barrier layer 5 to thereby perform on/off control.

The depression type n-channel MOSFET of control circuit 120 may be replaced by a resistor. When the scale of control circuit 120 is small, control circuit 120 can be produced simply.

As described above, in accordance with Embodiment 1, because first high withstand voltage transistor 110 and control circuit 120 are formed in one semiconductor device 100, the total size of a circuit in which first high withstand voltage transistor 110 and control circuit 120 are mounted can be greatly reduced. Moreover, because the whole of the circuit can be formed of a GaN semiconductor element, semiconductor device 100 can be used in a high temperature environment compared with the case where a control circuit formed of a Si semiconductor element is used. Moreover, because it is not necessary to provide any external component such as external wiring, lowering of the operating speed can be suppressed so that both power loss and cost can be reduced.

Embodiment 2

Figure 2:
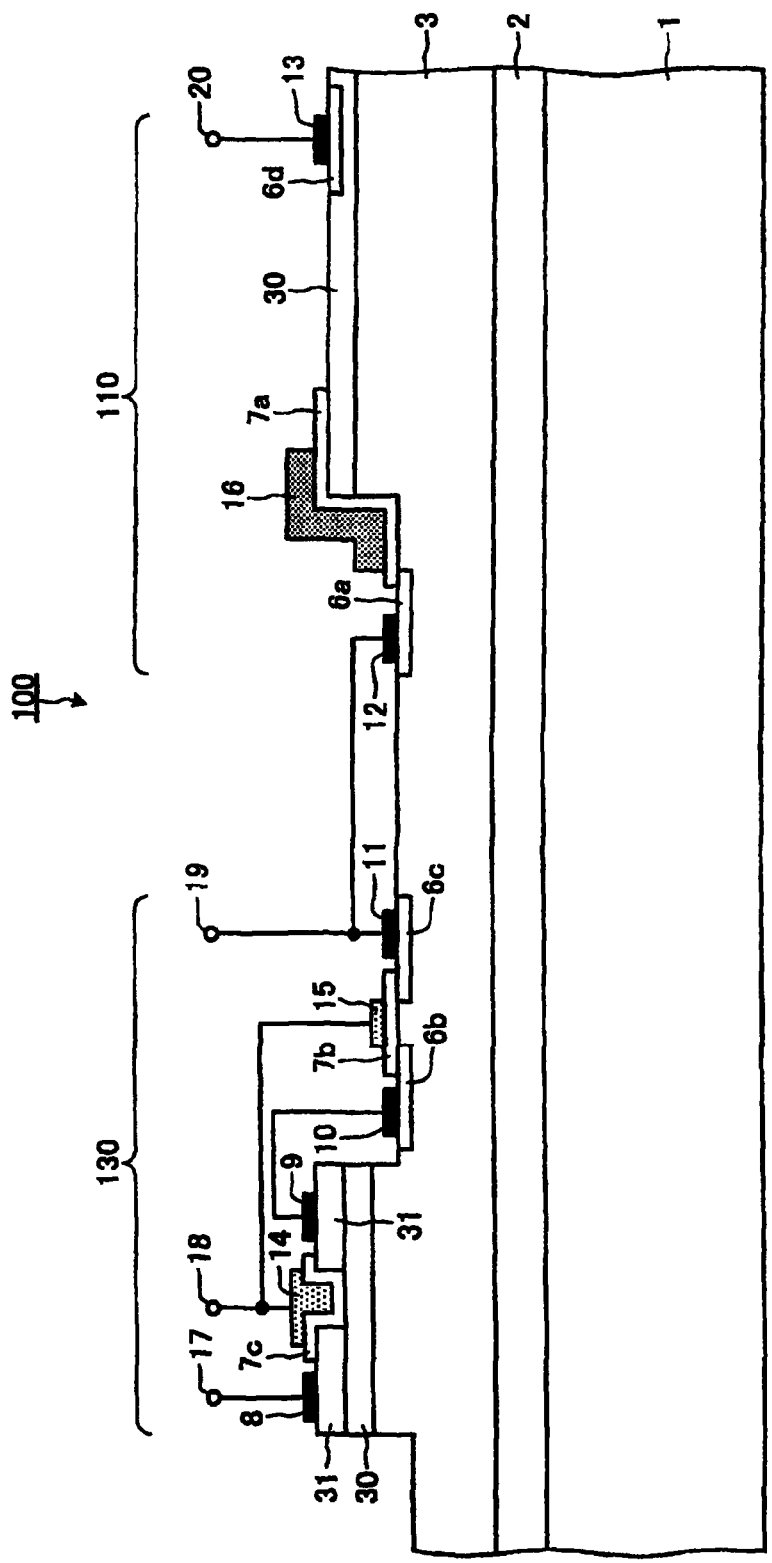
FIG. 2 is a sectional view showing a semiconductor device according to Embodiment 2.

FIG. 2 is a sectional view showing a semiconductor device according to Embodiment 2. A p-channel MOSFET (first conductivity type insulated gate field effect transistor) is provided in place of the depression type n-channel MOSFET of control circuit 120 in Embodiment 1. Each of first high withstand voltage transistor 110 and the p-channel MOSFET is formed in a structure without use of surface barrier layer 5 formed by two-dimensional electron gas.

Like Embodiment 1, insulating layer 2 is provided on a surface of semiconductor substrate 1. P-type (first conductivity type) first GaN layer 3 (first semiconductor layer) is provided on a surface of insulating layer 2. N-type (second conductivity type) second GaN layer 30 (second semiconductor layer) is provided on part of a surface of first GaN layer 3. P-type high concentration GaN layer 31 (third semiconductor layer) is provided on part of a surface of second GaN layer 30. Like Embodiment 1, a first recess which is dented but does not pierce first GaN layer 3 is provided in a region of first GaN layer 3 where second GaN layer 30 is not provided. Second GaN layer 30 is exposed on one side wall portion of the first recess. Second GaN layer 30 and high concentration GaN layer 31 are exposed on the other side wall portion of the first recess. A second recess which pierces high concentration GaN layer 31 is provided in high concentration GaN layer 31.

First high withstand voltage transistor 110 and control circuit 130 (second semiconductor element) are formed integrally on the aforementioned semiconductor substrate 1. First high withstand voltage transistor 110 is formed on a surface (equivalent to the first element region in Embodiment 1) of a region including part of the first recess and part of second GaN layer 30 where high concentration GaN layer 31 is not formed. First source region 6a and first source electrode 12 are provided in the same manner as in Embodiment 1. First gate insulating film 7a is formed to cover a range of from part of a surface of first source region 6a to part of the surface of second GaN layer 30. Third drain region 6d is provided in part of a surface layer of second GaN layer 30. First gate electrode 16 is provided between first source region 6a and third drain region 6d with interposition of first gate insulating film 7a. First drain electrode 13 is provided on a surface of third drain region 6d. Like Embodiment 1, high withstand voltage output terminal (OUT terminal) 20 is provided on first drain electrode 13.

Control circuit 130 includes an n-channel MOSFET formed in part (second element region) of the first recess, and a p-channel MOSFET formed on a surface (equivalent to the third element region in Embodiment 1) of high concentration GaN layer 31. The n-channel MOSFET of control circuit 130 is provided in the same manner as in Embodiment 1. In the p-channel MOSFET of control circuit 130, third drain electrode 8 and third source electrode 9 are provided on a surface of high concentration GaN layer 31 so as to be separated from each other. High concentration GaN layer 31 provided with third drain electrode 8 is equivalent to the second drain region. High concentration GaN layer 31 provided with third source electrode 9 is equivalent to the third source region. Third gate insulating film 7c is provided in the second recess of high concentration GaN layer 31 to cover a range of from bottom and side wall portions of the second recess to part of a surface of high concentration GaN layer 31. Third gate electrode 14 is provided through third gate insulating film 7c. Third gate electrode 14 is short-circuited to second gate electrode 15 of the n-channel MOSFET of control circuit 130. VD terminal 17 is connected to third drain electrode 8 of the p-channel MOSFET. Third source electrode 9 is short-circuited to second drain electrode 10 of the n-channel MOSFET of control circuit 130 so that a circuit output signal of control circuit 130 is output. The circuit output signal is input as a gate input signal to first gate electrode 16 of first high withstand voltage transistor 110.

In first high withstand voltage transistor 110, second GaN layer 30 serves as a drift region. Second GaN layer 30 is formed by epitaxial growth. For this reason, the channel mobility of second GaN layer 30 can be set to be substantially the same as the channel mobility of a single crystal layer. In the p-channel MOSFET of control circuit 130, high concentration GaN layer 31 serves as a source region and also as a drift region. High concentration GaN layer 31 can be formed as a p-type high concentration region, for example, by magnesium (Mg) doping and epitaxial growth.

Because first source electrode 12 is formed on a surface of first source region 6a which is a high concentration n-type layer, ohmic contact can be formed. The effect obtained by formation of first drain electrode 13 on a surface of third drain region 6d is the same as described above. Because control circuit 130 is formed as a CMOS structure including an n-channel MOSFET and a p-channel MOSFET, reduction in size of semiconductor device 100 can be attained so that the leakage current can be reduced greatly.

As described above, in accordance with Embodiment 2, the same effect as in Embodiment 1 can be obtained. Moreover, because second GaN layer 30 is formed by epitaxial growth, the channel mobility of second GaN layer 30 can be set to be substantially the same as the channel mobility of a single crystal layer. Moreover, because high concentration GaN layer 31 is formed by epitaxial growth, high concentration GaN layer 31 can be formed as a p-type high concentration region. Moreover, because control circuit 130 is formed as a CMOS structure, reduction in size of semiconductor device 100 can be attained so that the leakage current can be greatly reduced. Although it is difficult to control the thickness of each region of control circuit 130 if an attempt to form the region by ion implantation is made, it is possible to form each of second GaN layer 30 and high concentration GaN layer 31 with an accurate thickness easily because each layer is formed by epitaxial growth. For this reason, the control circuit 130 can be formed easily to have desired characteristic.

Embodiment 3

Figure 3:
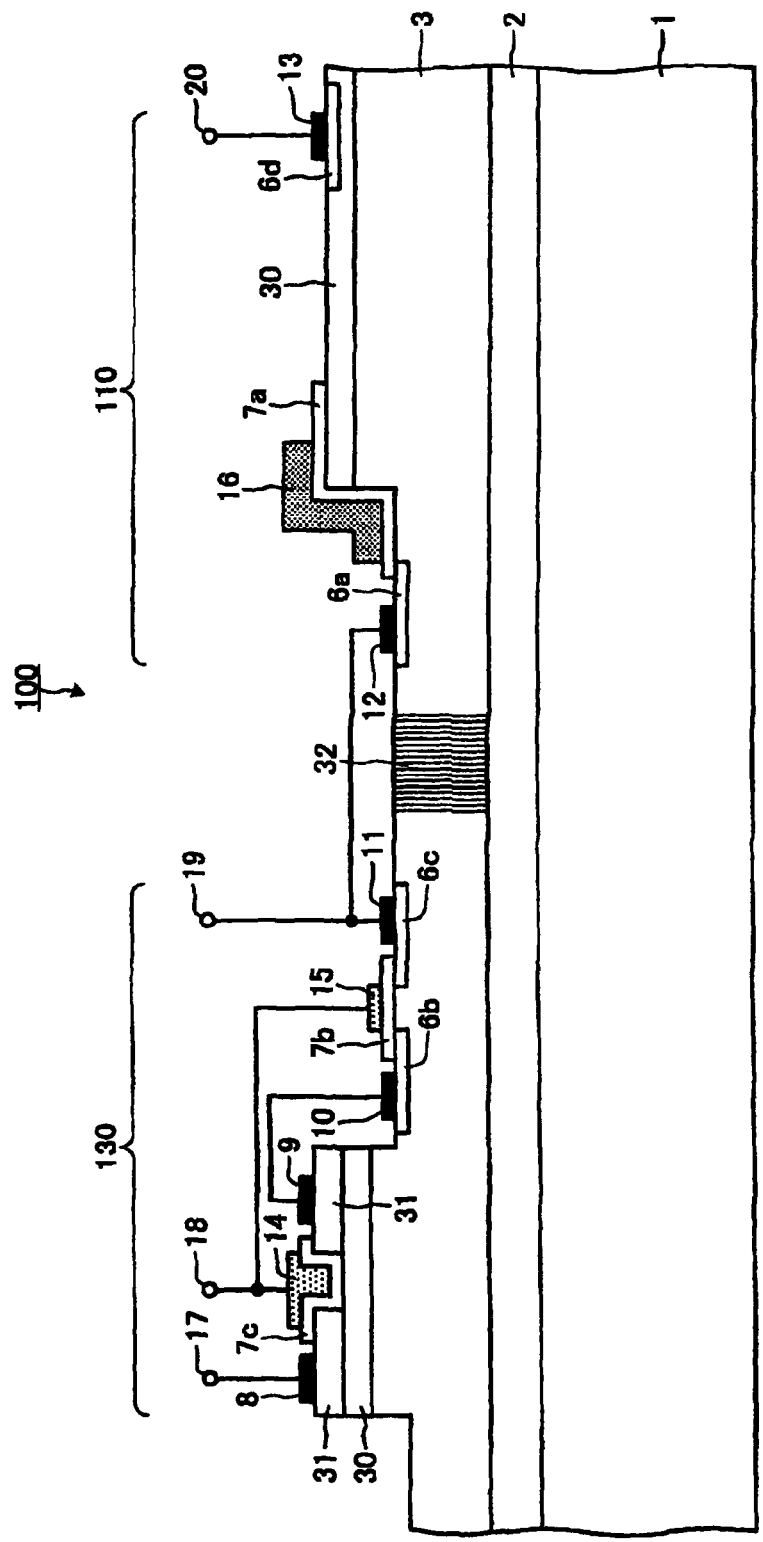
FIG. 3 is a sectional view showing a semiconductor device according to Embodiment 3.

FIG. 3 is a sectional view showing a semiconductor device according to Embodiment 3. Insulating region 32 may be formed in first GaN layer 3 between first high withstand voltage transistor 110 and control circuit 130 in Embodiment 2, that is, insulating region 32 may be formed between the first element region and the second element region to obtain a structure in which first high withstand voltage transistor 110 and control circuit 130 are electrically insulated from each other.

The structure of first high withstand voltage transistor 110 and control circuit 130 is the same as in Embodiment 2. Insulating region 32 is formed in first GaN layer 3 so as to pierce first GaN layer 3 between first high withstand voltage transistor 110 and control circuit 130. Insulating region 32 may be provided as a region having first GaN layer 3 partially removed. Alternatively, insulating region 32 may be provided as a region filled with an insulating substance such as silicon dioxide ($SiO_2$).

Insulating region 32 can prevent part of a transient current produced in first high withstand voltage transistor 110 from flowing into control circuit 130. For example, at the time of high-speed switching, a high voltage is applied to a pn junction of first GaN layer 3 and second GaN layer 30 in first high withstand voltage transistor 110, so that a transient current flows to electrically charge the pn junction. There is a possibility that part of the transient current may flow into control circuit 130 via first GaN layer 3 used in common to first high withstand voltage transistor 110 and control circuit 130. The provision of insulating region 32 in first GaN layer 3 makes it possible to block the transient current flowing into control circuit 130 to thereby prevent the breakdown and malfunction of control circuit 130.

As described above, in accordance with Embodiment 3, the same effect as in Embodiment 2 can be obtained. Moreover, the provision of insulating region 32 in the first GaN layer 3 makes it possible to block the transient current flowing into control circuit 130 to thereby prevent the breakdown and malfunction of control circuit 130.

Embodiment 4

Figure 4:
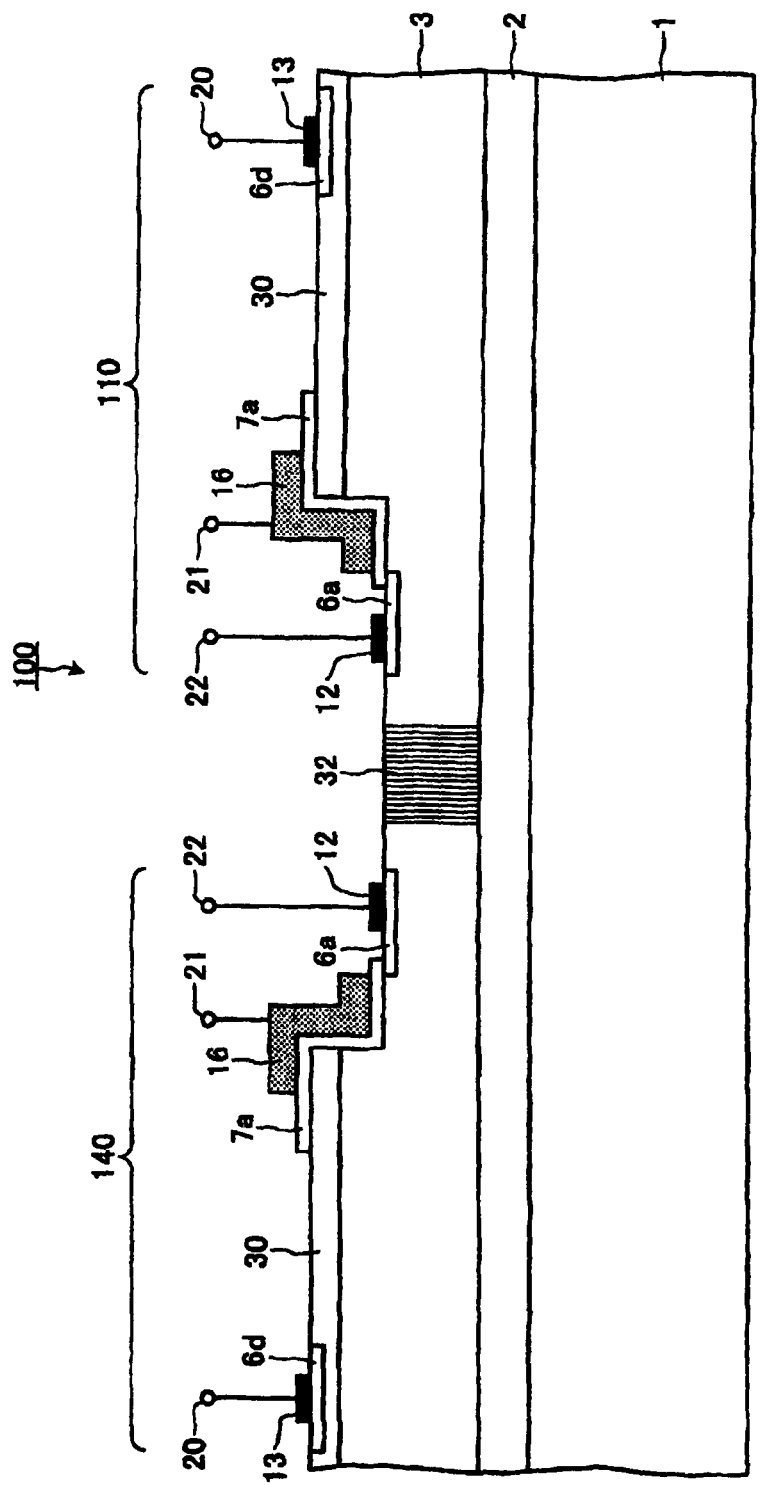
FIG. 4 is a sectional view showing a semiconductor device according to Embodiment 4.

FIG. 4 is a sectional view showing a semiconductor device according to Embodiment 4. Control circuit 130 in Embodiment 2 may be replaced by second high withstand voltage transistor 140 to obtain a structure in which a plurality of high withstand voltage transistors are provided integrally in semiconductor device 100. Insulating region 32 may be provided in first GaN layer 3 between the respective high withstand voltage transistors to obtain a structure in which the respective high withstand voltage transistors are electrically insulated from each other.

The structure of first high withstand voltage transistor 110 is the same as in Embodiment 2. In Embodiment 4, first gate electrode 16 is provided with IN terminal 21. First source electrode 12 is provided with GND terminal 22. The structure of second high withstand voltage transistor 140 is the same as that of first high withstand voltage transistor 110.

Insulating region 32 is formed in first GaN layer 3 so that insulating region 32 pierces first GaN layer 3 between first high withstand voltage transistor 110 and second high withstand voltage transistor 140 in the same manner as in Embodiment 3. The provision of insulating region 32 in first GaN layer 3 can prevent a transient current from flowing between first high withstand voltage transistor 110 and second high withstand voltage transistor 140 in the same manner as in Embodiment 3. Alternatively, first drain electrode 13 may be provided on a surface of each third drain region 6d without provision of insulating region 32 to obtain a structure in which first high withstand voltage transistor 110 and second high withstand voltage transistor 140 can be electrically insulated from each other. If a plurality of transistors use a common source region, it is not necessary to provide insulating region 32.

As described above, in accordance with Embodiment 4, the formation of first high withstand voltage transistor 110 and second high withstand voltage transistor 140 in one semiconductor device 100 makes it possible to greatly reduce the total size of a circuit in which a plurality of high withstand voltage transistors are mounted. In addition, the provision of insulating region 32 in first GaN layer 3 makes it possible to obtain the same effect as in Embodiment 3.

Embodiment 5

Figure 5:
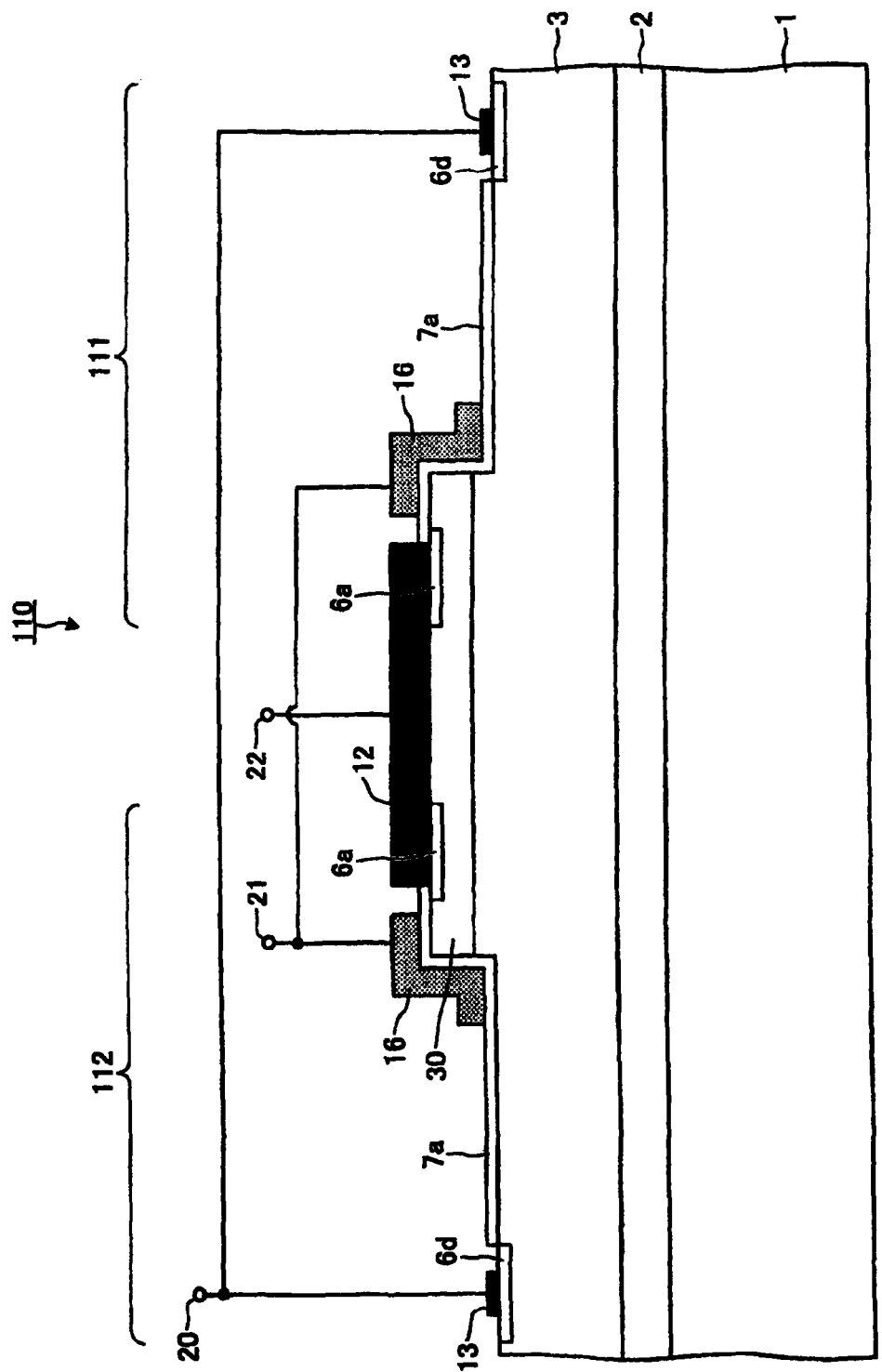
FIG. 5 is a sectional view showing a semiconductor device according to Embodiment 5.

FIG. 5 is a sectional view showing a semiconductor device according to Embodiment 5. Incidentally, the control circuit and the second high withstand voltage transistor (see FIGS. 2 to 4) formed on one substrate are not shown in FIG. 5 (also not shown in FIG. 6). In each of Embodiments 2 to 4, the conductivity type of first GaN layer 3 and the conductivity type of second GaN layer 30 may be replaced by an n-type and a p-type respectively. A plurality of transistors may be provided as first high withstand voltage transistors 110 with a structure in which a source region common to the transistors is provided.

In Embodiment 5, insulating layer 2 and n-type first GaN layer 3 are laminated in this order on a surface of semiconductor substrate 1. P-type second GaN layer 30 is provided on part of a surface of first GaN layer 3. A plurality of third recesses which are dented but do not pierce first GaN layer 3 are provided in regions of first GaN layer 3 where second GaN layer 30 is not provided. End portions of second GaN layer 30 are exposed on side wall portions of the third recesses.

For example, first high withstand voltage transistor 110 includes first and second transistors 111 and 112 with a high withstand voltage. First transistor 111 is formed in part of surfaces of the third recess and second GaN layer 30. First source region 6a is provided in part of a surface of second GaN layer 30. First gate insulating film 7a is formed to cover a range of from part of a surface of first source region 6a to part of a surface of the bottom of the third recess. Third drain region 6d is provided in part of a surface of the bottom of the third recess. The other structure of first transistor 111 is the same as that of the high withstand voltage transistor according to Embodiment 4.

The structure of second transistor 112 is the same as that of first transistor 111 except that second transistor 112 is formed in a third recess different from that in first transistor 111 and second GaN layer 30 used in common with first transistor 111.

First source electrode 12 is provided in common to first and second transistors 111 and 112 to cover a range of from part of a surface of first source region 6a of the first transistor 111 to part of a surface of first source region 6a of second transistor 112. First drain electrode 13 of second transistor 112 is short-circuited to first drain electrode 13 of first transistor 111. First gate electrode 16 of second transistor 112 is short-circuited to first gate electrode 16 of first transistor 111.

When a control circuit not shown is provided as a semiconductor element adjacent to first high withstand voltage transistor 110, an n-channel MOSFET of the control circuit may be formed, for example, in part of a surface of the bottom of a third recess in the same manner as in Embodiment 1. Alternatively, the n-channel MOSFET may be formed on a surface of second GaN layer 30 where first high withstand voltage transistor 110 is not formed, in the same manner as in Embodiment 2. In addition, a p-channel MOSFET of the control circuit may be formed on a surface of second GaN layer 30 where first high withstand voltage transistor 110 is not formed, in the same manner as in Embodiment 2.

When a second high withstand voltage transistor not shown is provided as a semiconductor element adjacent to first high withstand voltage transistor 110, the second high withstand voltage transistor may be formed in the third recess and second GaN layer 30 where first high withstand voltage transistor 110 is not formed, so that the second high withstand voltage transistor has the same structure as that of first high withstand voltage transistor 110.

Incidentally, first high withstand voltage transistor 110 may include only first transistor 111.

As described above, in accordance with Embodiment 5, the same effect as in Embodiments 2 to 4 can be obtained.

Embodiment 6

Figure 6:
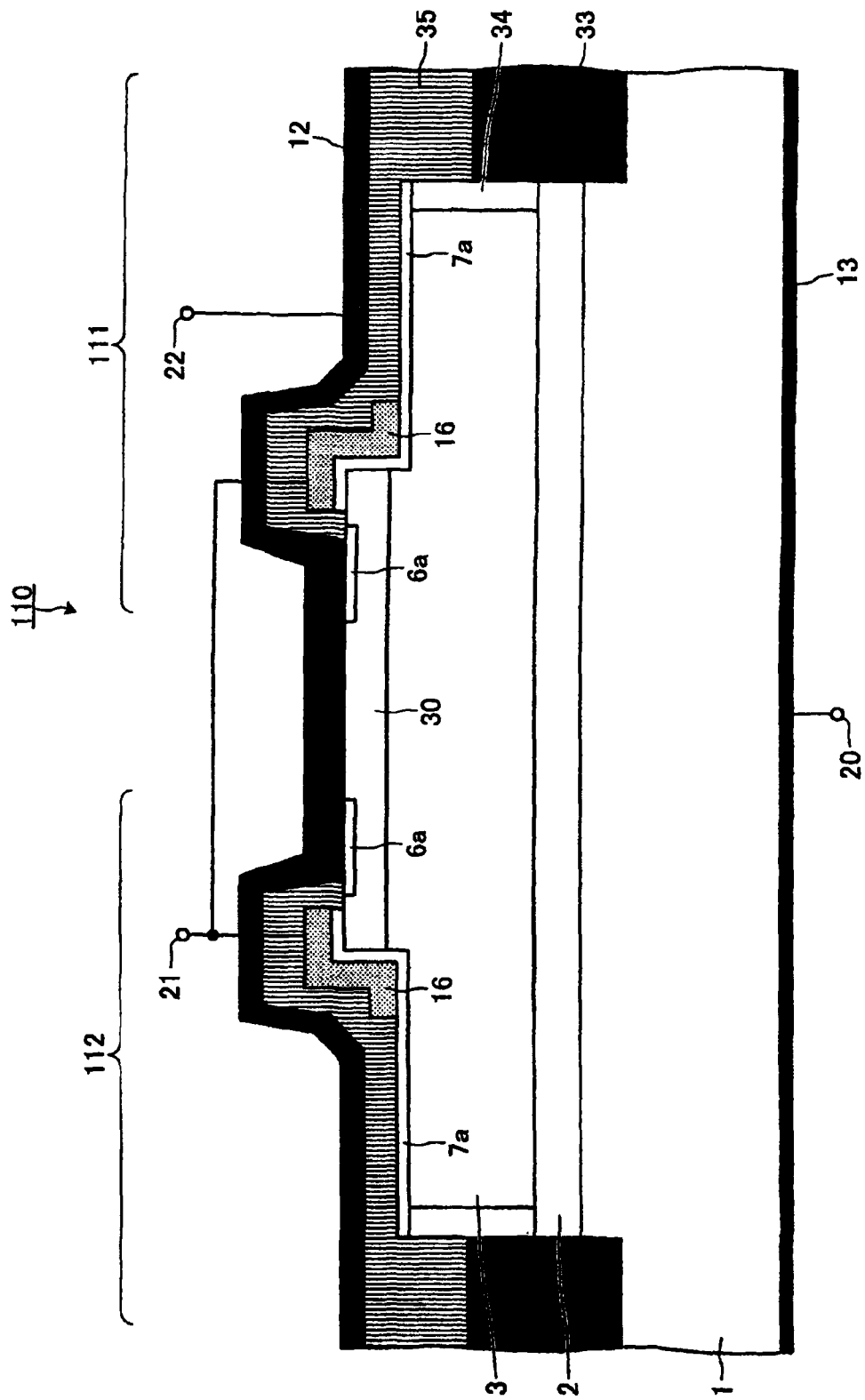
FIG. 6 is a sectional view showing a semiconductor device according to Embodiment 6.

FIG. 6 is a sectional view showing a semiconductor device according to Embodiment 6. In Embodiment 5, first drain electrode 13 may be provided on a rear surface of semiconductor substrate 1 so that first high withstand voltage transistor 110 is provided as a quasi-vertical structure.

In Embodiment 6, a fourth recess which is dented but does not pierce semiconductor substrate 1 is provided in part of the third recess so as to be apart from second GaN layer 30. Electrode (hereinafter referred to as 'short-circuit electrode') 33 for short-circuiting semiconductor substrate 1 and first GaN layer 3 is embedded in the fourth recess so as to come into contact with semiconductor substrate 1 and first GaN layer 3. N-type high concentration region 34 is provided in a surface layer of first GaN layer 3 exposed on a side wall portion of the fourth recess. That is, n-type high concentration region 34 is provided in the boundary between first GaN layer 3 and short-circuit electrode 33 so as to come into contact with short-circuit electrode 33. N-type high concentration region 34 has a higher concentration than that of first GaN layer 3. N-type high concentration region 34 is equivalent to a high concentration semiconductor region.

First source electrode 12 is electrically insulated first GaN layer 3, first gate electrode 16 and short-circuit electrode 33 by interlayer insulating film 35. First drain electrode 13 is provided on a surface of semiconductor substrate 1 opposite to insulating layer 2 (i.e., on a rear surface of semiconductor substrate 1). Semiconductor substrate 1 has a conducting property. First drain electrode 13 may be provided in common to first and second transistors 111 and 112. The other structure is the same as in Embodiment 5.

The aforementioned configuration permits a current to flow into semiconductor substrate 1 from first source region 6*a* provided in second GaN layer 30. In addition, a current flowing in first GaN layer 3 can be collected to short-circuit electrode 33 via n-type high concentration region 34. Accordingly, first high withstand voltage transistor 110 can be provided as a quasi-vertical structure. Incidentally, the structure shown in the sectional view of FIG. 6 may be regarded as one cell shaped like a stripe extending in a direction of depth, so that a plurality of such cells are provided in parallel and connected to one another at end portions of the stripes to thereby form one semiconductor device.

As described above, in accordance with Embodiment 6, the same effect as in Embodiment 5 can be obtained. Moreover, for example, an electrode pad etc. for connecting first drain electrode 13 of first high withstand voltage transistor 110 to the front surface of first high withstand voltage transistor 110 becomes unnecessary at the time of mounting semiconductor device 100 having first high withstand voltage transistor 110 formed therein, so that the region for the unnecessary electrode pad, etc. can be reduced. Therefore, reduction in size can be attained. Moreover, because the material cost of the unnecessary electrode pad, etc. can be reduced, the total production cost of a circuit in which semiconductor device 100 is mounted can be reduced.

Embodiment 7

Figure 7:
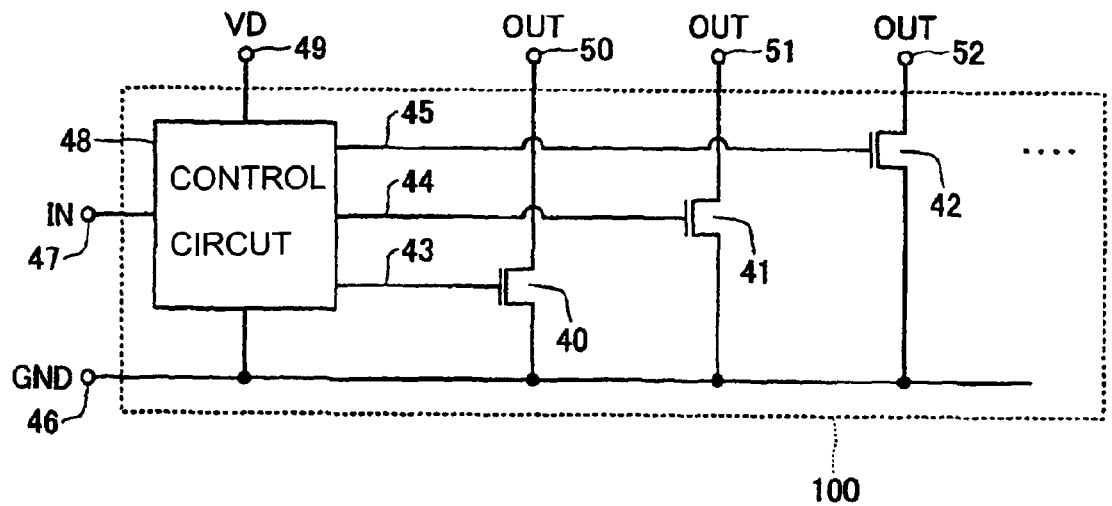
FIG. 7 is a circuit diagram showing a semiconductor device using semiconductor switches according to the invention.

FIG. 7 is a circuit diagram showing a semiconductor device using semiconductor switches according to the invention. Semiconductor device 100 shown in each of Embodiments 1 to 4 can be used for forming a circuit as shown in FIG. 7. The circuit shown in FIG. 7 includes semiconductor switches 40 to 42 (fourth semiconductor switch et seq. are not shown), control circuit 48, GND terminal 46, IN terminal 47, VD terminal 49, and OUT terminals 50 to 52. Semiconductor switches 40 to 42 and control circuit 48 are formed in one semiconductor device 100.

Drain terminals of semiconductor switches 40 to 42 are connected to OUT terminals 50 to 52 respectively. Source terminals of semiconductor switches 40 to 42 are connected to GND terminal 46. Gate terminals of semiconductor switches 40 to 42 are connected to control circuit 48. GND terminal 46, IN terminal 47 and VD terminal 49 are connected to control circuit 48.

Control circuit 48 is a circuit for driving semiconductor switches 40 to 42 alternately at predetermined timing. Input signal from the IN terminal 47 is input as one of gate input signals 43 to 45 to one of semiconductor switches 40 to 42. For example, when semiconductor switch 40 should be driven, gate input signal 43 is selected.

On this occasion, for example, semiconductor switch 40 is equivalent to first high withstand voltage transistor 110 in Embodiment 1. Each of semiconductor switches 41 and 42 is also equivalent thereto. For example, control circuit 48 is equivalent to control circuit 120 in Embodiment 1. GND terminal 46 is equivalent to GND terminal 19 in Embodiment 1. IN terminal 47 is equivalent to IN terminal 18 in Embodiment 1. VD terminal 49 is equivalent to VD terminal 17 in Embodiment 1. Each of OUT terminals 50 to 52 is equivalent to OUT terminal 20 in Embodiment 1.

The circuit shown in FIG. 7 can be used as a protection circuit for preventing the breakdown of a semiconductor device by detecting a temperature exceeding an operating temperature, an overcurrent, etc. or as a timer circuit which can be set to be controlled at desired timing.

Figure 8:
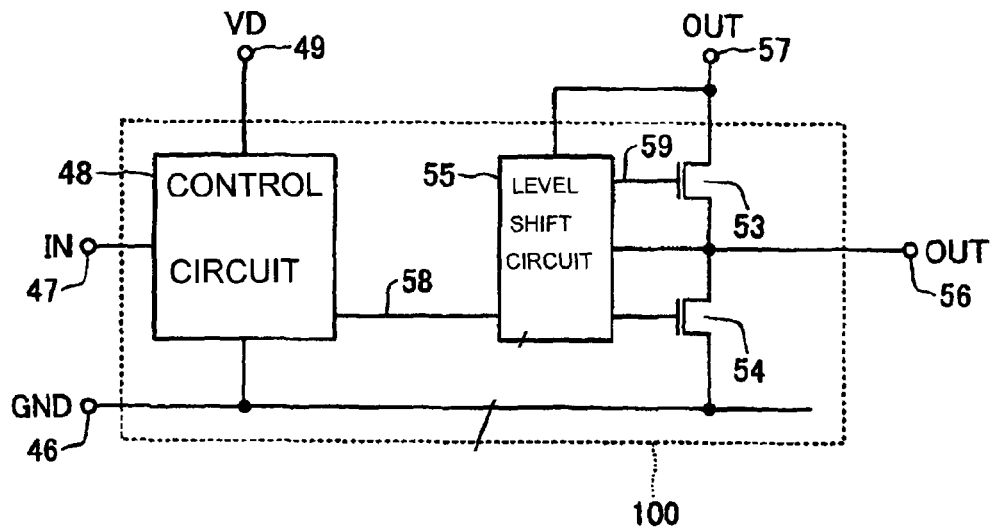
FIG. 8 is a circuit diagram showing another example of the semiconductor device using semiconductor switches according to the invention.

FIG. 8 is a circuit diagram showing another example of the semiconductor device using semiconductor switches according to the invention. Configuration may be made so that a source terminal of semiconductor switch 53 is connected to a drain terminal of semiconductor switch 54. The circuit shown in FIG. 8 includes semiconductor switches 53 and 54, control circuit 48, level shift circuit 55, GND terminal 46, IN terminal 47, VD terminal 49, and OUT terminals 56 and 57. Semiconductor switches 53 and 54, control circuit 48 and level shift circuit 55 are formed in one semiconductor device 100.

A drain terminal of semiconductor switch 53 is connected to OUT terminal 57. A source terminal of semiconductor switch 53 is connected to a drain terminal of semiconductor switch 54. A source terminal of semiconductor switch 54 is connected to GND terminal 46. Gate terminals of semiconductor switches 53 and 54 are connected to level shift circuit 55.

Level shift circuit 55 is connected to OUT terminal 57 through a junction between semiconductor switches 53 and 54. Level shift circuit 55 is further connected to OUT terminal 57, GND terminal 46 and control circuit 48. GND terminal 46, IN terminal 47 and VD terminal 49 are connected to control circuit 48.

Control circuit 48 feeds input signal 58 to level shift circuit 55. Level shift circuit 55 converts input signal 58 received from control circuit 48 into a signal to be input to corresponding one of semiconductor switches 53 and 54. For example, level shift circuit 55 converts input signal 58 received from control circuit 48 into a high potential signal and feeds the high potential signal as gate input signal 59 to semiconductor switch 53.

On this occasion, for example, semiconductor switch 53 is equivalent to first high withstand voltage transistor 110 in Embodiment 1. Semiconductor switch 54 is also equivalent thereto. OUT terminal 56 is equivalent to OUT terminal 20 in Embodiment 1. OUT terminal 57 is also equivalent thereto. The other configuration corresponding to Embodiment 1 is the same as that of the circuit shown in FIG. 7.

Incidentally, when a high withstand voltage transistor is further required for obtaining the circuit configuration as shown in FIG. 8, the high withstand voltage transistor may be formed in the same manner as semiconductor switches 53 and 54. In addition, a plurality of high withstand voltage transistors each having a connection structure of semiconductor switches 53 and 54 may be provided.

As described above, in accordance with Embodiment 7, the same effect as in Embodiment 1 can be obtained.

Embodiment 8

Figure 9:
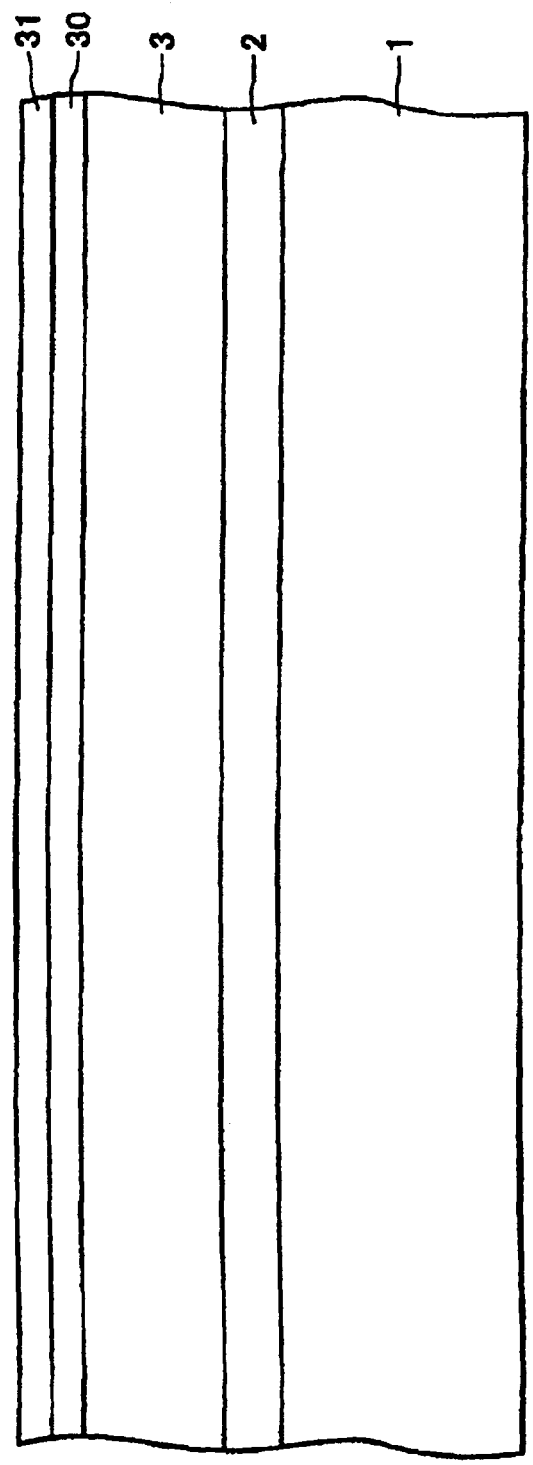
FIG. 9 is a sectional view showing a semiconductor device producing method according to the invention.

A method for producing a semiconductor device according to the invention will be described. FIGS. 9 to 13 are sectional views showing a method for producing a semiconductor device according to the invention. Description will be made here while the semiconductor device according to Embodiment 2 is taken as an example. First, as shown in FIG. 9, insulating layer 2, p-type (first conductivity type) first GaN layer 3, n-type (second conductivity type) second GaN layer 30 and p-type high concentration GaN layer 31 are laminated in this order on a surface of semiconductor substrate 1, for example, by an MOCVD method.

Figure 10:
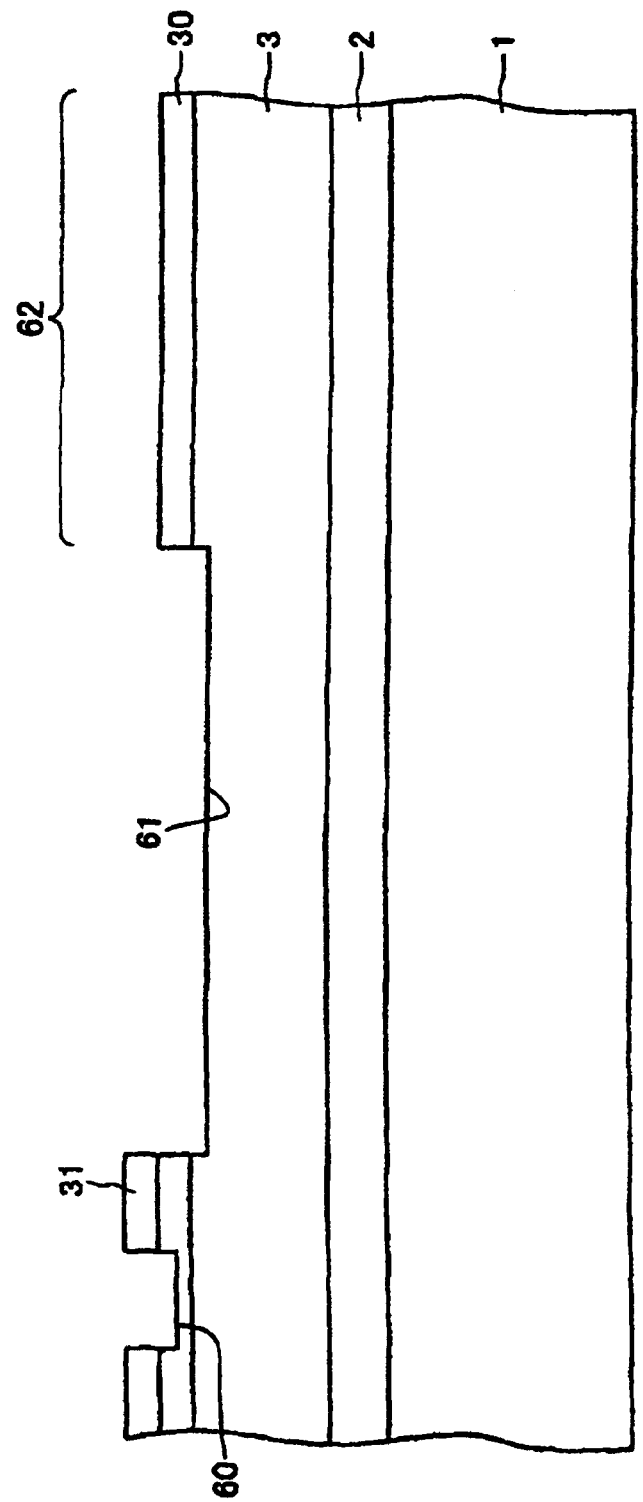
FIG. 10 is a sectional view showing the semiconductor device producing method according to the invention.

Then, as shown in FIG. 10, high concentration GaN layer 31 is removed from part of a surface layer of the semiconductor substrate 1 to thereby form region 62 in which second GaN layer 30 is exposed. Trench 61 (first recess) which reaches first GaN layer 3 but does not pierce first GaN layer 3 is formed in another part of the surface layer of semiconductor substrate 1. A portion of region 62 and trench 61 is the first element region. A portion of trench 61 is the second element region. Trench 60 (second recess) which pierces high concentration GaN layer 31 so that second GaN layer 30 is exposed is formed in another part of the surface layer of semiconductor substrate 1. The region is the third element region.

Figure 11:
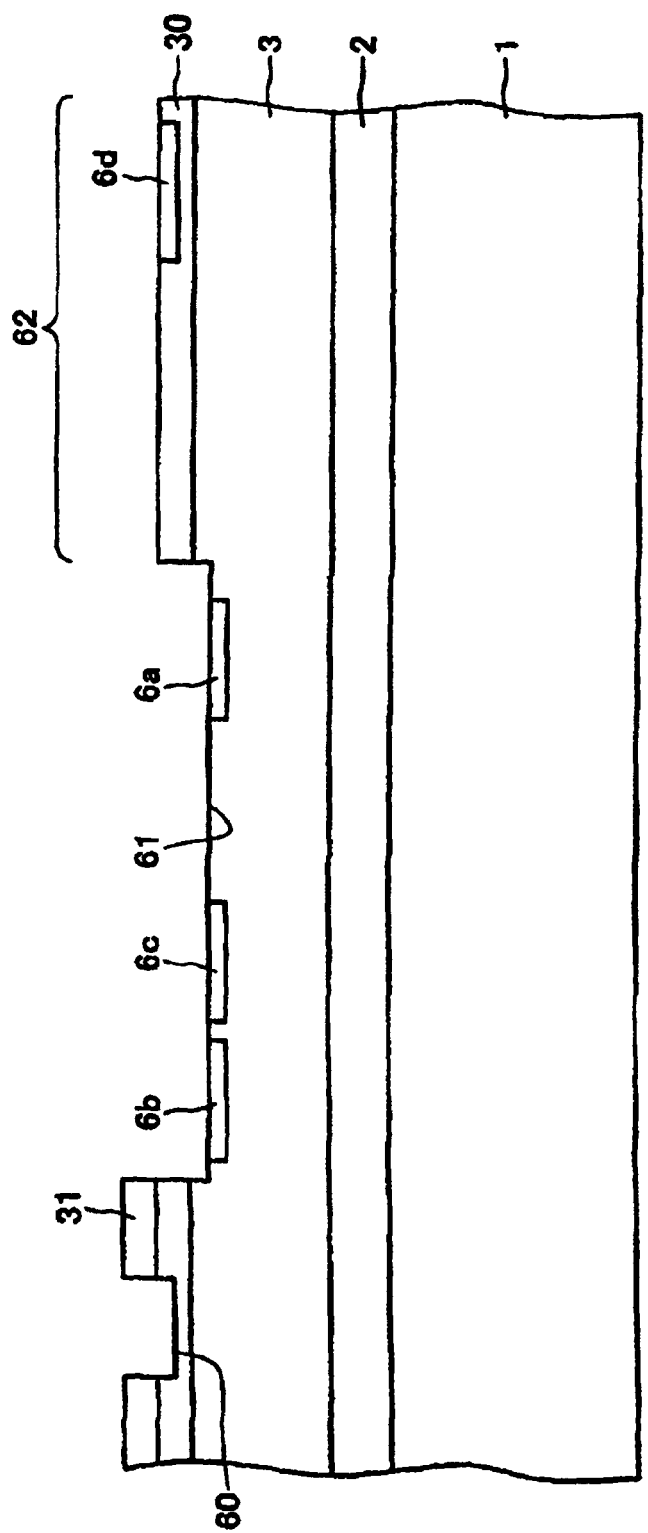
FIG. 11 is a sectional view showing the semiconductor device producing method according to the invention.

Then, as shown in FIG. 11, high concentration n-type regions are formed simultaneously, for example, by ion implantation of silicon, etc. in part of the bottom of trench 61 and region 62 and heat treatment at about 1000° C. The high concentration n-type regions are first source region 6a, first drain region 6b, second source region 6c and third drain region 6d.

Figure 12:
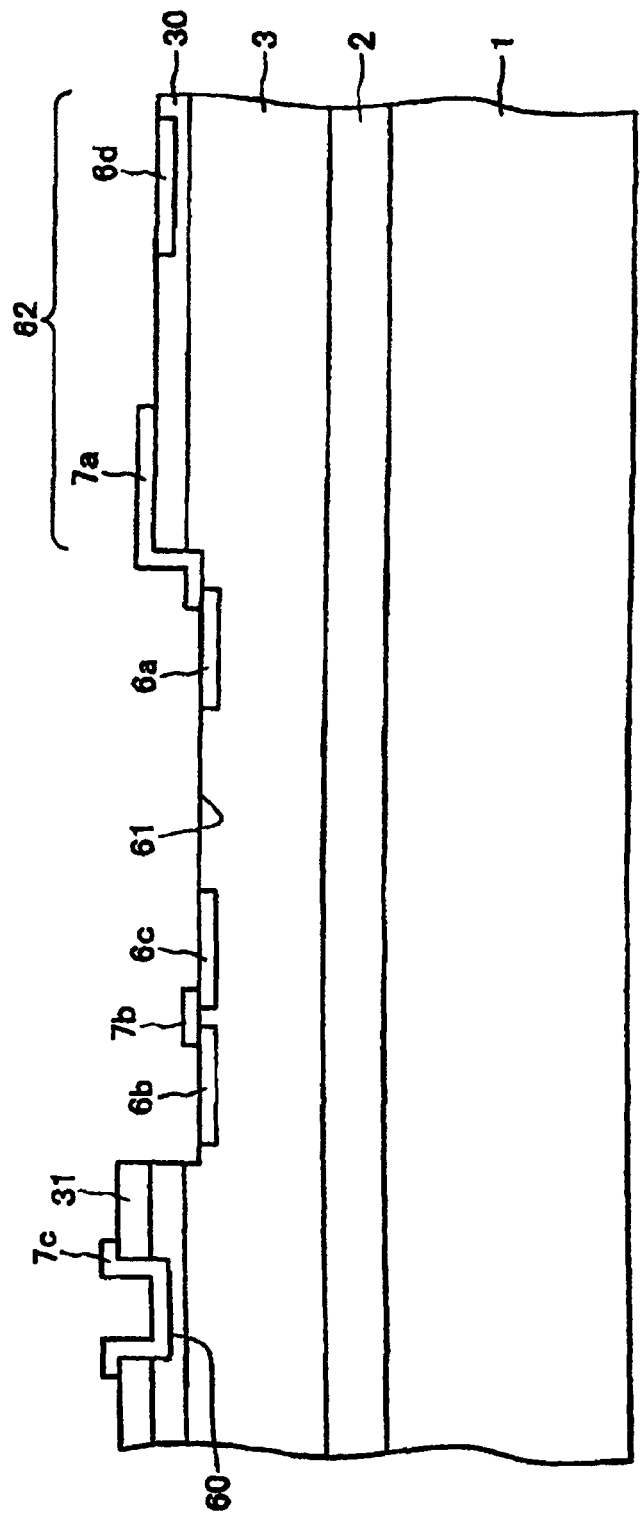
FIG. 12 is a sectional view showing the semiconductor device producing method according to the invention.

Then, as shown in FIG. 12, desired shape gate insulating films are formed in a plurality of regions for example, by a plasma chemical vapor deposition (plasma CVD) method for performing vapor deposition by exciting a raw material gas like plasma or by a thermal chemical vapor deposition (thermal CVD) method for performing vapor deposition under thermal reaction of a raw material gas. The gate insulating films are first gate insulating film 7a, second gate insulating film 7b and third gate insulating film 7c.

Figure 13:
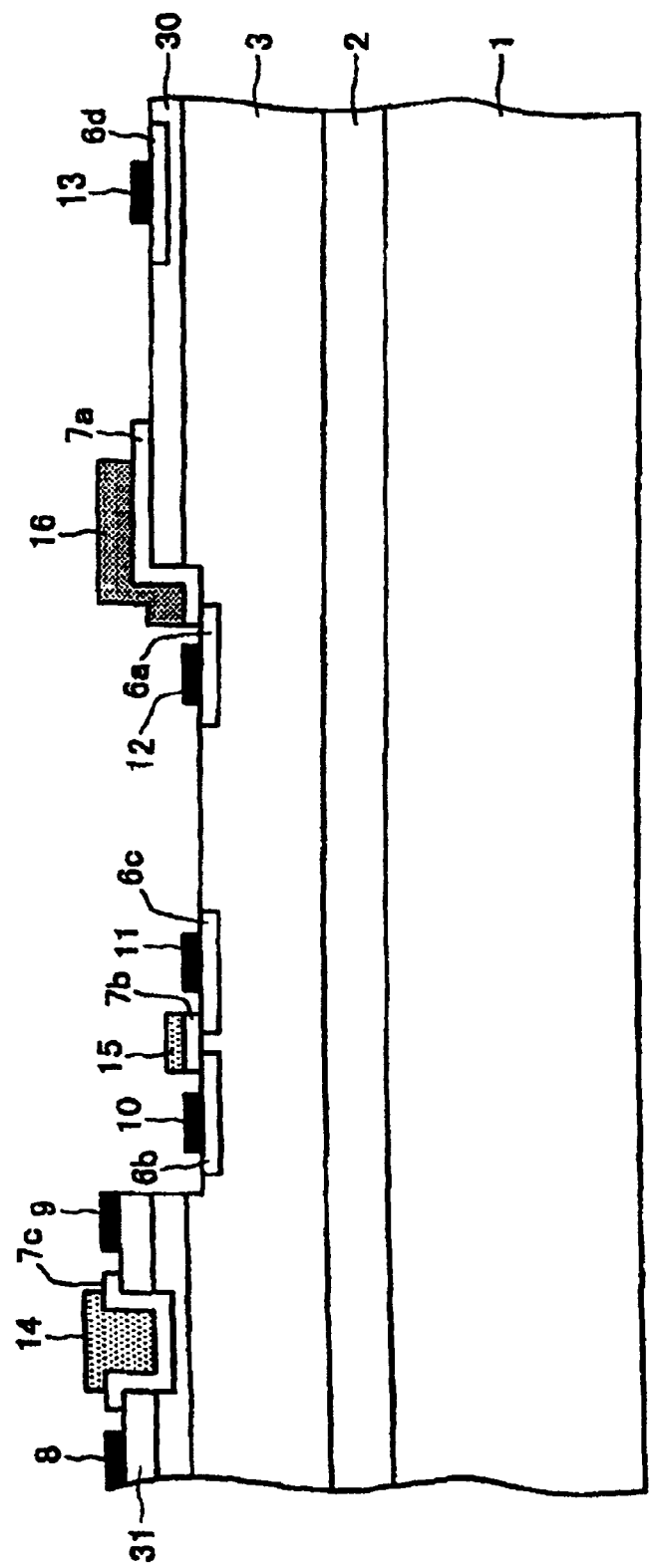
FIG. 13 is a sectional view showing the semiconductor device producing method according to the invention.
Figure 14:
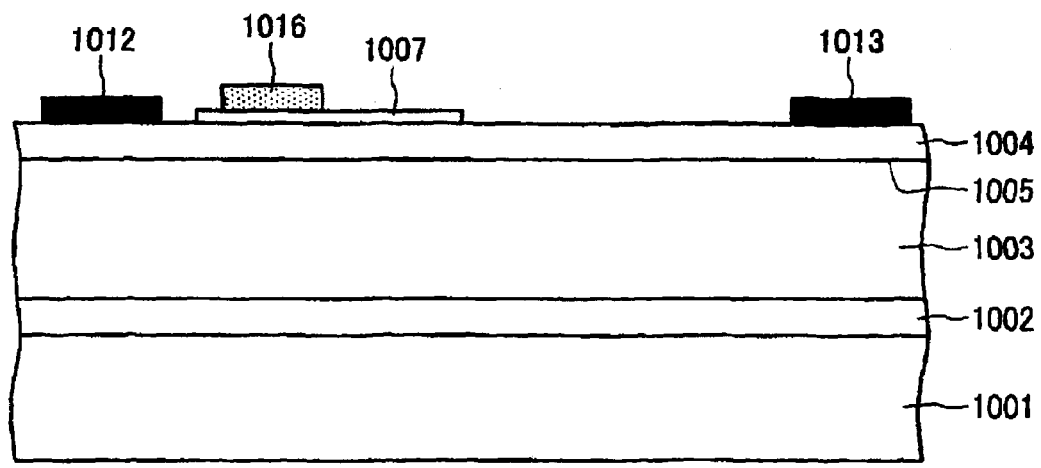
FIG. 14 is a sectional view showing a lateral structure gallium nitride semiconductor element according to the background art.
Figure 15:
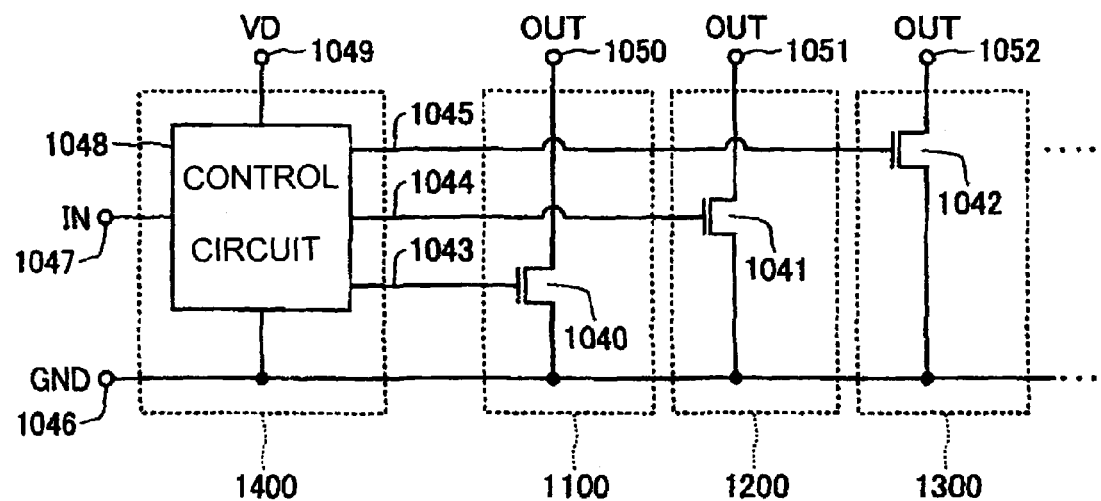
FIG. 15 is a circuit diagram typically showing a semiconductor device using semiconductor switches according to the background art.

Then, as shown in FIG. 13, electrodes of desired shapes are formed simultaneously in a plurality of portions, for example, by use of titanium (Ti), aluminum (Al), nickel (Ni), etc. The electrodes formed in the first element region are first source electrode 12, first drain electrode 13 and first gate electrode 16. The electrodes formed in the second element region are second drain electrode 10, second source electrode 11 and second gate electrode 15. The electrodes formed in the third element region are third drain electrode 8, third source electrode 9 and third gate electrode 14. Then, the respective electrodes are connected to desired terminals or electrodes to thereby complete semiconductor device 100 as shown in FIG. 2.

For example, a GaN single crystal substrate, a silicon carbide (SiC) substrate, a sapphire substrate, a silicon substrate, etc. can be used as semiconductor substrate 1. When a sapphire substrate is used as semiconductor substrate 1, it is not necessary to provide insulating layer 2 because the sapphire substrate itself has the same effect as that of the insulating layer 2. The use of the sapphire substrate as semiconductor substrate 1 permits a thick GaN layer to be formed easily because the thermal expansion coefficient of the GaN layer is close to that of the sapphire substrate. Thickening of the GaN layer makes it possible to easily provide electrical insulation between the high withstand voltage transistor and the control circuit formed on semiconductor substrate 1. The use of a silicon substrate as semiconductor substrate 1 permits the size of semiconductor substrate 1 to be increased so that cost of the semiconductor chip can be reduced. In semiconductor device 100 according to Embodiment 6, a conductive substrate such as a GaN single crystal substrate, a silicon carbide (SiC) substrate or a silicon substrate may be preferably used so that first drain electrode 13 can be formed on the rear surface of semiconductor substrate 1.

Silicon dioxide, silicon nitride (SiN), etc. may be used as the gate insulating film. Polysilicon may be used for forming the gate electrode. After the respective electrodes are formed, heat treatment may be performed, for example, at about 400° C. under an atmosphere containing hydrogen (H2) to smoothen irregularity etc. produced in the surface of the gate insulating film by the electrode formation.

Incidentally, semiconductor device 100 according to Embodiment 1 is produced as follows. First, undoped or n-type first GaN layer 3 is formed on a surface of semiconductor substrate 1 by epitaxial growth. AlGaN layer 4 is formed on a surface of first GaN layer 3 by epitaxial growth. Trench 61 which reaches first GaN layer 3 but does not pierce first GaN layer 3 is formed in part of AlGaN layer 4. Then, a source region, a drain region, a gate insulating film, a source electrode, a drain electrode and a gate electrode are formed and connected to respective terminals in the same manner as in the aforementioned production method. When the respective layers are formed by epitaxial growth in this manner, the same effect as in Embodiment 2 can be obtained.

Semiconductor device 100 according to each of Embodiments 5 and 6 is produced as follows. Semiconductor substrate 1 in which n-type first GaN layer 3 and p-type second GaN layer 30 are laminated in this order by epitaxial growth is used. When the respective layers are formed by epitaxial growth in this manner, the same effect as in Embodiment 2 can be obtained. A trench which reaches first GaN layer 3 but does not pierce first GaN layer 3 is formed in part of second GaN layer 30. In the semiconductor device according to Embodiment 6, a trench which reaches the semiconductor substrate 1 but does not pierce the semiconductor substrate 1 is further formed in part of the aforementioned trench.

As described above, in accordance with Embodiment 8, the same effect as in Embodiment 1 can be obtained. Because first high withstand voltage transistor 110 and control circuit 130 can be formed to have structures similar to each other, semiconductor device 100 can be produced with little increase in the number of production steps. Accordingly, the production cost can be reduced.

Although the aforementioned embodiments have been described in the case where high withstand voltage elements for forming a high withstand voltage transistor and low withstand voltage elements for forming a control circuit are formed on one semiconductor substrate, the devices may be configured such that a plurality of high withstand voltage elements are formed on one semiconductor substrate while low withstand voltage elements are formed on another semiconductor substrate. The reason is as follows. A process of producing a high withstand voltage transistor such as a transistor or a diode is accompanied by more or less increase in the number of steps compared with a process of producing a control circuit. When the area of the control circuit is equal to or larger than the area of the high withstand voltage transistor, the size of the semiconductor device cannot be reduced and the number of steps for producing the control circuit increases apparently even if the high withstand voltage transistor and the control circuit were formed on one semiconductor substrate. Therefore, when configuration is made so that a plurality of high withstand voltage transistors are formed simultaneously on one substrate while the control circuit is formed on another semiconductor substrate, the production steps can be unified so that reduction in production cost can be attained.

For production of a normally-off type GaN semiconductor element, configuration may be made so that a gate electrode is formed on a surface of a semiconductor substrate through an insulating film of silicon dioxide etc., for example, in the same manner as in production of an ordinary Si semiconductor element. Configuration may be made so that an MOSFET structure is formed in a gate region of a high electron mobility transistor (HEMT). Especially, the normally-off type GaN semiconductor element in the former configuration can be produced easily.

Although the invention has been described in the case where a circuit of inverter configuration is taken as an example, the invention is not limited to the aforementioned embodiments and may be applied to circuits of various configurations.

As described above, the semiconductor device according to the invention is useful as a power semiconductor device used in a power converter of an inverter or the like, a power supply device of any industrial machine or an igniter of a car.

Thus, a semiconductor device has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

This application is based on and claims priority to Japanese Patent Application JP 2008-253165, filed on Sep. 30, 2008, and Japanese Patent Application JP 2009-087896, filed on Mar. 31, 2009. The disclosure of these priority applications in their entirety, including the drawings, claims, and the specifications thereof, is incorporated herein by reference.

What is claimed is:

1. A gallium nitride semiconductor device comprising:
a first semiconductor layer containing gallium nitride;
a second semiconductor layer containing gallium nitride and formed on part of a surface of the first semiconductor layer;
a first semiconductor element formed in the first and second semiconductor layers and having a high withstand voltage; and
a second semiconductor element formed in either the first or the second semiconductor layer and having a low withstand voltage,
wherein the first semiconductor layer has an insulating region provided between the first and second semiconductor elements for separating the first and second semiconductor elements from each other,
wherein the first semiconductor element uses the second semiconductor layer as a drift region, and further comprises a second conductivity type first source region formed on a surface layer of the first semiconductor layer where the second semiconductor layer is not formed,
wherein the second semiconductor element further has a high concentration first conductivity type third semiconductor layer formed on a surface of the second semiconductor layer,
wherein the second semiconductor element is formed from a first conductivity type insulated gate field effect transistor and a second conductivity type insulated gate field effect transistor,
wherein the first conductivity type insulated gate field effect transistor has a second source region and a first drain region on a surface of the first semiconductor layer, and
wherein the second conductivity type insulated gate field effect transistor uses the third semiconductor layer as a third source region and a second drain region.

2. The gallium nitride semiconductor device according to claim 1,
wherein the first semiconductor layer is of the first conductivity type,
wherein the second semiconductor layer is of the second conductivity type, and
wherein the gallium nitride semiconductor device further comprises a first gate insulating film formed to cover a range of from part of a surface of the first source region to the second semiconductor layer; and a first gate electrode provided on a surface of the first gate insulating film.

3. A method of producing the gallium nitride semiconductor device according to claim 1, comprising the steps of:
epitaxially growing the second conductivity type second semiconductor layer containing gallium nitride on a surface of the first conductivity type first semiconductor layer containing gallium nitride;
removing part of the second semiconductor layer;
forming the low withstand voltage second semiconductor element on the first and second semiconductor layers while forming the high withstand voltage first semiconductor element on the first and second semiconductor layers; and
epitaxially growing the high concentration first conductivity type third semiconductor layer on part of the surface of the second semiconductor layer before forming the first and second semiconductor elements.

* * * * *